United States Patent
Inaba et al.

(10) Patent No.: US 6,661,734 B2
(45) Date of Patent: Dec. 9, 2003

(54) SEMICONDUCTOR MEMORY DEVICE

(75) Inventors: Tsuneo Inaba, Kamakura (JP); Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/193,223

(22) Filed: Jul. 12, 2002

(65) Prior Publication Data

US 2003/0012075 A1 Jan. 16, 2003

(30) Foreign Application Priority Data

Jul. 12, 2001  (JP) ........................................ 2001-212590

(51) Int. Cl.[7] ................................................ G11C 8/00
(52) U.S. Cl. ............................ 365/230.06; 365/230.08; 365/230.03
(58) Field of Search ....................... 365/230.06, 230.08, 365/189.11, 230.03

(56) References Cited

U.S. PATENT DOCUMENTS 5,602,774 A * 2/1997 Elrabaa et al. ......... 365/230.08
5,886,944 A * 3/1999 Ahn ....................... 365/230.06
6,262,934 B1   7/2001 Uehara

FOREIGN PATENT DOCUMENTS

JP          2000-36191          2/2002

* cited by examiner

Primary Examiner—Huan Hoang
(74) Attorney, Agent, or Firm—Oblon, Spivak, McClelland, Maier & Neustadt, P.C.

(57) ABSTRACT

A semiconductor memory device is disclosed, in which a first word drive line control circuit which supplies a word drive voltage corresponding to the decode output of the decoding circuit to the first word drive line, and has a first reset circuit which resets the first word drive line to a first potential when a first control signal is activated and a second reset circuit which resets the first word drive line to a second potential when a second control signal is activated, and a two-stage reset control circuit which controls changeover from the activated state of the first control signal to the activated state of the second control signal on the basis of the potential of the first word drive line to change the potential of the first word drive line in two stages.

23 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2001-212590, filed Jul. 12, 2001, the entire contents of which are incorporated herein by reference.

BACKGROUND OF THE INVENTION

1. Field of the Invention

The present invention relates to a semiconductor memory device, and more particularly to a semiconductor memory device with a word drive line reset circuit of a type in which a potential of the word drive line through which a word line drive voltage is supplied is reset in two stages, and it is used, for example, in a DRAM (dynamic random access memory) employing NWR (negative word line reset) system.

2. Description of the Related Art

In a DRAM, it is preferred to decrease the current consumption by maintaining the cut-off current (Ioff) of a memory cell transistor at low level, and also to cope with the trend of higher operating speed and lower supply voltage by lowering the threshold voltage of a memory cell transistor.

To satisfy such contradictory demands, hitherto, the gate oxide film of the memory cell transistor has been improved to have a high breakdown voltage and the gate film thickness has been thinned, and using the improved S-factor of the memory cell transistor, a low threshold voltage was maintained while keeping the Ioff at low level.

However, as the DRAM becomes finer and the supply voltage is further lowered, it is becoming hard to satisfy the contradictory requirements of low level of Ioff and low threshold voltage of the memory cell transistor. For example, since the electric field (Eox) applied to the gate oxide film is 6 MV/cm or more at the present, the conventional technique is beyond the limit.

To solve this problem, the NWR system has been proposed. In the NWR system, the resetting potential of the word line is set at a negative potential (Vnn), the gate-source voltage Vgs when the memory cell transistor is off is set at a negative value (Vgs<0), and therefore both low Ioff level and low threshold voltage are realized.

Here is discussed the amount Q of electric charge flowing into a power supply line Vnn in the resetting operation of the word line. The electric charge amount Q, as expressed in formula Q=CV, is expressed by the product of capacity C and potential difference V.

First considering the capacity, the word lines are connected to gate electrodes of a plurality of memory cells, and have the coupling capacity with bit lines and memory cell capacitors, and hence the capacity is large. Word drive lines are shared by a plurality of row decoders, and hence the capacity is also relatively large.

As for the potential difference, a boosting potential (Vpp) is generally used as the setting potential of the word lines in order to write "H" level data in the memory cell. Accordingly, since the electric charge amount Q is expressed by the product of capacity C and potential difference V as described above, then when resetting the word line, the voltage swing Vpp-Vnn is large. Therefore, in resetting operation of the word line, the amount of electric charge flowing into the power supply line Vnn is very large. As a result, a large current flows into the power supply line Vnn in a relatively short time.

Vnn is generally produced in a chip by means of a charge pump circuit, and supplied to the necessary circuits in the chip via the power supply line Vnn composed of metal wiring or the like. The charge pump circuit is generally high in output impedance. Thus, when a large current flows into the power supply line Vnn in a relatively short time, the potential of the power supply line Vnn locally rises, which is known as a power supply bounce.

Since the word line in an inactivated state is electrically connected to a Vnn power supply line, the potential of the inactivated word line is boosted by this power supply bounce, and the electric charge accumulated in the memory cell may leak.

To suppress the power supply bounce, it may be attempted to provide a plenty of stabilizing capacitors for Vnn near the row decoders, or decrease the RC product of the power supply line wiring (decrease the resistance of wiring material, decrease the dielectric constant of insulating material, or increase the width of power supply wiring).

In the former case, however, the problem is the increase of chip area, and hence it is not realistic to provide stabilizing capacitors for Vnn in the core circuit. In the latter case, improvement or modification of wiring material and insulation film material may lead to increase in the cost of development, increase in the period of development, and increase in the necessary chip area. Also in the latter case, if low RC product of wiring material is realized, a large capacity is needed in the charge pump circuit for generating Vnn, rendering the necessary chip area large.

To suppress the power supply bounce of the power supply line of such negative potential (Vnn) and to reduce the load to the negative potential generating circuit, for example, as disclosed in Jpn. Pat. Appln. KOKAI Publication No. 2000-36191, a method of resetting by dividing the word line potential of DRAM in two stages is proposed (known as t within wo-stage resetting method). In this two-stage resetting method, when resetting the word lines, the potential of the word lines and the word drive lines is first set at the grounding potential (Vss), and then set at Vnn, so that an electric current flown into the Vnn power supply line may be decreased than conventional.

FIG. 5A is a block diagram of an example of connectional relation between a word drive line drive circuit and a plurality of row decoders in a conventional DRAM with the two stage reset system. In FIG. 5A, the word drive line drive circuit resets the word drive line potential in two stages, and thus resets the word line potential in two stages.

In FIG. 5A, a word drive line drive circuit (WDRV DRV) 41 is provided in each unit block of a memory cell array, that is, in every sub array (not shown). A block select signal BlockSel for selecting the sub array and a row address signal Addr for specifying a selection line within the sub array are inputted to the word drive line drive circuit (WDRV DRV) 41. Also, a first reset control signal Reset<0> and a second reset control signal Reset<1> are inputted to the word drive line drive circuit (WDRV DRV) 41.

A plurality of sub row decoders (SRD#0, SRD#1, . . . , SRD#n) 420 to 420n are provided corresponding to a plurality of sub word lines SWL<0>, SWL<1), . . . , SWL<n> in every sub array. A word drive voltage is supplied from the word drive line drive circuit 41 through first word drive line wdrv_p to the sub row decoders (SRD#0, SRD#1, . . . , SRD∩n) 420 to 420n, and a word drive signal is supplied from the word drive line drive circuit 41 through second word drive line wdrv_n to the sub row decoders (SRD#0, SRD#1, . . . , SRD#n) 420 to 420n. Also, the sub row decoders (SRD#0, SRD#1, ..., SRD#n) 420 to 420n receive and decode an address signal MWL for specifying a selection sub word line (a row address input other than the row address signal Addr for specifying the selection line within the sub array) to selectively drive a corresponding sub word line SWL<0>, SWL<1>, ..., SWL<n>.

A delay circuit (Delay) 43 receives the first reset control signal Reset<0>, and produces the second reset control signal Reset<1>.

FIG. 5B is a signal chart showing the timing relation between the reset control signal Reset<0> and the reset control signal Reset<1> in the block diagram in FIG. 5A.

FIG. 6 is a circuit diagram of the word drive line drive circuit 41 in FIG. 5A.

In FIG. 6, reference numeral 51 is a decoding circuit, 52 is a dynamic latch circuit, 53 is a level shifting circuit, 54 is a first word drive line drive circuit, and 55 is a second word drive line drive circuit. Further, Vii is a power supply voltage (for example, an internal power supply voltage down-converted from an external power supply voltage in a DRAM), Vpp is a boosted power supply voltage boosted within a DRAM, Vnn is a negative voltage, and Vss is the ground potential.

The first word drive line control circuit 54 comprises a PMOS (P-channel MOS) transistor P1 for driving word drive lines, two NMOS (N-channel MOS) transistors N0, N1, and an NMOS transistor N2. The PMOS transistor P1 for driving word drive lines is driven by an output signal of the level shifting circuit 53 and outputs a word drive voltage to the first word drive line wdrv_p. The two NMOS transistors N0, N1 are connected in series between the drain of the PMOS transistor P1 (connection node of the first word drive line wdrv_p) and Vss node. The NMOS transistor N2 is connected between the source of the NMOS transistor N0 and Vnn node.

The second word drive line control circuit 55 receives a signal of output node A (node A) of the latch circuit 52, and outputs a word drive signal to the second word drive line wdrv_n.

FIG. 7 is a circuit diagram cited for explaining the principle of two-stage resetting operation in the circuit in FIG. 6. FIG. 7 shows a circuit comprising part of the first word drive line control circuit 54, one sub row decoder SRD connected to the first word drive line wdrv_p, one sub word line SWL connected to the sub row decoder SRD, and memory cells MC.

The sub row decoder SRD comprises a PMOS transistor P2 for driving word lines, NMOS transistor N3 for word line potential pull-down, and an NMOS transistor N4 for noise killer. The word line driving PMOS transistor P2 has the source connected to the first word drive line wdrv_p and the drain connected to the sub word line SWL, and receives a word line select signal MWL at the gate. The word line potential pull-down NMOS transistor N3 has the drain connected to the sub word line SWL and the source connected to the Vnn node, and receives the MWL at the gate. The noise killer NMOS transistor N4 is connected parallel to the NMOS transistor N3 and receives the word drive signal at the gate from wdrv_n.

FIG. 8 is a signal chart of an example of two-stage resetting operation in the circuit in FIG. 7.

First, when resetting the wdrv_p, the output Set of the level shifting circuit 53 is "L" level, and the PMOS transistor P1 in the first word drive line control circuit 54 is turned on, and the wdrv_p becomes "H" level. At this time, the resetting NMOS transistors N1 and N2 are in off state. At this time, the wdrv_n is "L" level.

Next, when resetting the wdrv_p, first the output Set of the level shifting circuit 53 becomes "H" level, and the PMOS transistor P1 in the first word drive line control circuit 54 is turned off.

Consequently, the reset control signal Reset<0> becomes "H" level for a short time, and the resetting NMOS transistor N1 is turned on for a short time, so that the electric charge of wdrv_p is discharged in Vss node. As a result, the resetting NMOS transistor N2 is turned on, and the charge of wdrv_p is discharged in Vnn node. At this time, the wdrv_n is "H" level, and the noise killer NMOS transistor N4 in the sub row decoder SRD is turned on, and the charge of wdrv_n is discharged to Vnn node.

By such two-stage resetting operation, the amount of electric charge flowing from the word drive line into the Vnn node is decreased, and the bounce of the Vnn supply line is suppressed.

In such two-stage resetting method, however, since resetting operation of the word drive line is executed twice as mentioned above, control lines are required for both the circuit for connecting the word drive line to Vss and the circuit for connecting the word drive line to Vnn. To determine the second resetting operation timing (that is, the timing of changing over the word drive line from connection with Vss to connection with Vnn), hitherto, the delay circuit (Delay) 43 (FIG. 5A) for delaying the reset control signal by a predetermined time, or the timing generation circuit (not shown) for determining the reset operation timing by monitoring the potential of the word drive line is shared by reset circuits of word drive lines. These circuits are, however, relatively large in the pattern area, and it is difficult to arrange these circuits on a core portion having little extra space in layout region, and thus the word drive line drive circuit can be disposed only in the peripheral portion of the core portion. Accordingly, a fluctuation occurs in the RC delay of each control line wired from the peripheral portion of the core to each reset circuit, and it is hard to set the operation timing of each reset circuit at high precision.

Thus, in the conventional circuit for resetting the word drive line potential in two stages, the layout area on the memory chip is relatively large, and it is hard to set the operation timing of each reset circuit at high precision.

BRIEF SUMMARY OF THE INVENTION

According to an aspect of the present invention, there is provided a semiconductor memory device comprising at least one memory cell array in which a plurality of word lines and a plurality of bit lines intersect with each other, including a plurality of memory cells to be selected by the word lines and the bit lines; a word drive line drive circuit which decodes one part of an address signal, and outputs a word drive voltage to a first word drive line; and a plurality of row decoders which are provided corresponding to the plurality of word lines in the memory cell array and supplied with a word drive control signal from the first word drive line, and decode other part than the one part of the address signal to selectively drive a corresponding word line, wherein the word drive line drive circuit comprises a decoding circuit which decodes the one part of the address signal; a latch circuit which latches the decode output of the decoding circuit, and receives a reset control signal for controlling the reset start timing of the first word drive line to reset the decode output of the decoding circuit; a first word drive line control circuit which supplies a word drive voltage corresponding to the decode output of the decoding circuit to the first word drive line, and has a first reset circuit connected between the first word drive line and a first potential node to reset the first word drive line to a first potential when a first control signal is activated and a second reset circuit connected between the first word drive line and a second potential node to reset the first word drive line to a second potential when a second control signal is activated; and a two-stage reset control circuit which controls changeover from the activated state of the first control signal to the activated state of the second control signal on the basis of the potential of the first word drive line to change the potential of the first word drive line in two stages including a first stage of the first potential and a second stage of the second potential.

DETAILED DESCRIPTION OF THE INVENTION

Figure 1A:
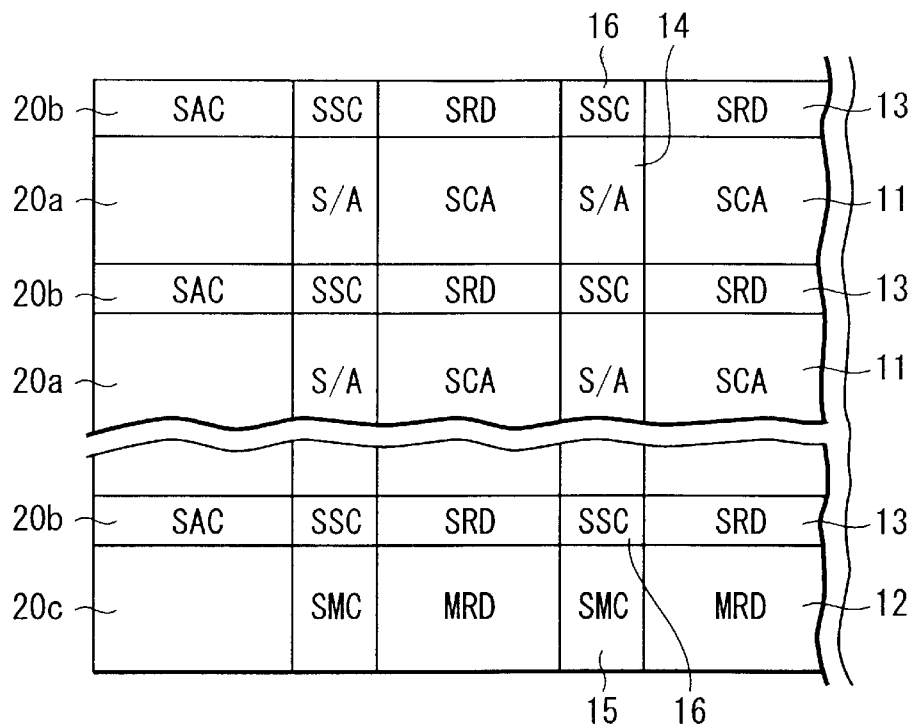
FIG. 1A is a diagram showing a layout of DRAM according to an embodiment of the present invention.

Referring now to the drawings, preferred embodiments of the invention are specifically described below.

Figure 1B:
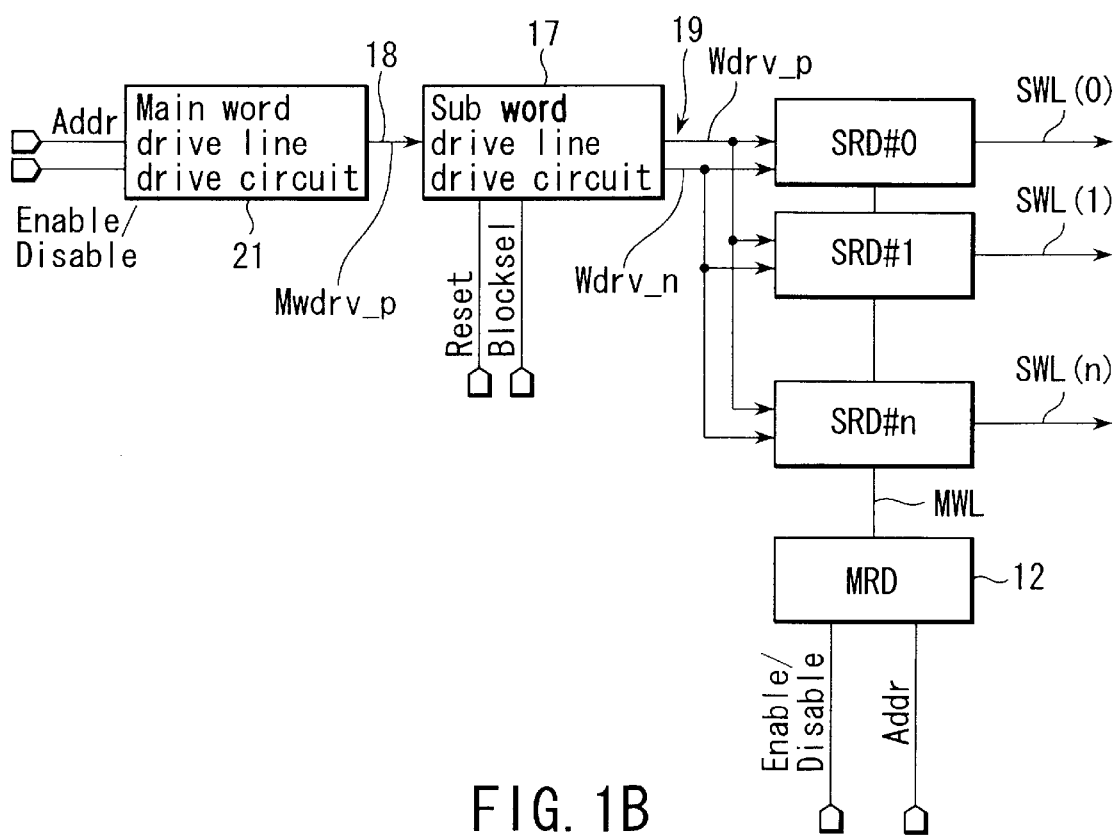
FIG. 1B is a block diagram of part of the DRAM in FIG. 1A.

FIG. 1A shows a hierarchical word drive line configuration and NWR (negative word line reset) system. It is a diagram showing a layout of DRAM according to an embodiment of the invention. FIG. 1B is a block diagram of part of the DRAM in FIG. 1A, particularly a block diagram showing the word drive line system and the word line system of the DRAM.

Figure 1C:
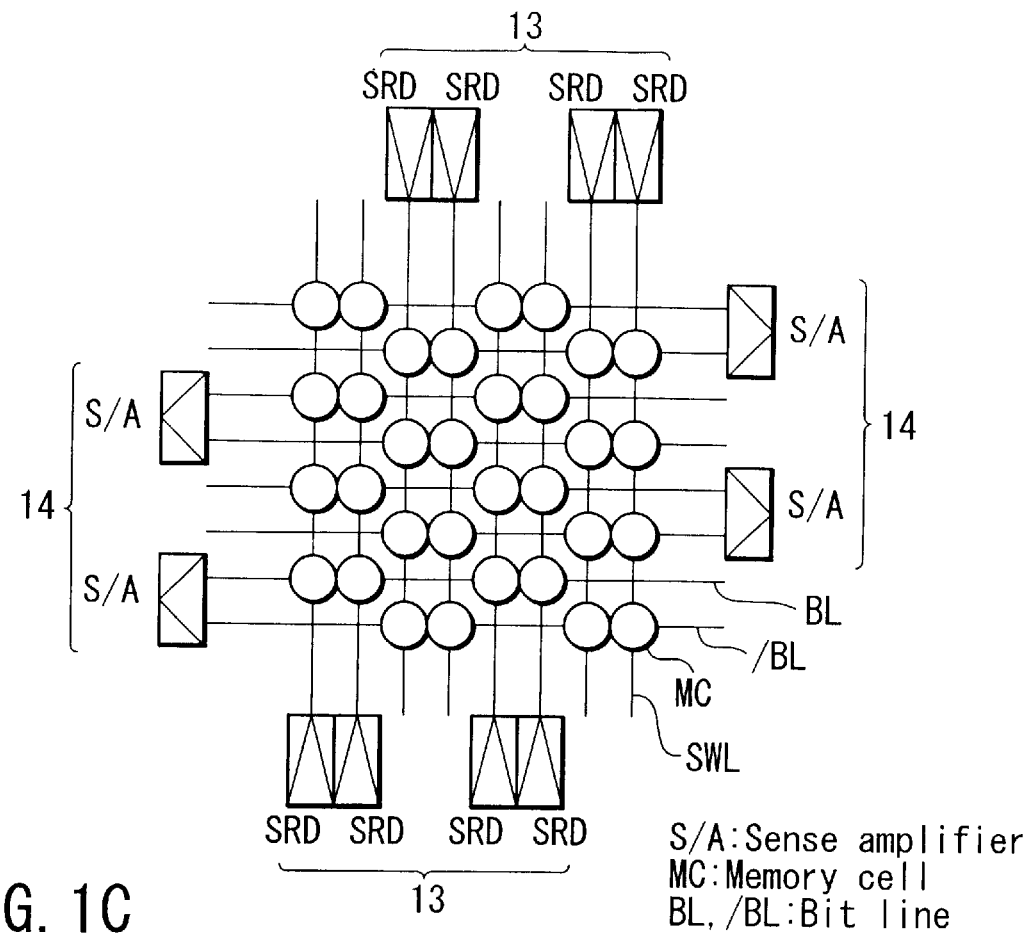
FIG. 1C is a diagram showing the detail of pattern in one specific sub array (SCA) 11 in the DRAM in FIG. 1A.

FIG. 1C is a diagram showing the connectional relation of the memory cells, the row decoders and the sense amplifiers in one specific sub array (SCA) 11 in the DRAM in FIG. 1A.

In FIG. 1A, the memory cell array is divided in a matrix form in unit blocks of sub arrays (SCA) 11. In each sub array 11, as shown in FIG. 1C, a plurality of word lines SWL are arranged to intersect with a plurality of bit lines BL, /BL, and memory cells MC are arranged in the intersections of the word lines SWL and bit lines BL, /BL.

As shown in FIG. 1A, at one end of each row (row direction), a main row decoder (MRD) 12 is provided as a main word line drive circuit. As shown in FIG. 1A and FIG. 1C, a sub row decoder (SRD) 13 for word line selection drive is provided at one end of each sub array 11 in the word line direction (line direction). The sub row decoder (SRD) 13 is, as shown in FIG. 1A and FIG. 1C, especially in FIG. 1C, composed of a plurality of sub row decoders. The main row decoder (MRD) 12 is also composed of a plurality of main row decoders in a similar manner to the sub row decoder (SRD) 13, though not shown. As shown in FIG. 1C, a sense amplifier (S/A) 14 is provided at one end of each sub array 11 in the bit line direction (column direction), and connected to a pair of complementary bit lines BL, /BL. The sense amplifier (S/A) 14 is composed of a plurality of sense amplifiers. The sense amplifier (S/A) 14 may be of shared system to be shared by two sub arrays 11 adjacent in the column direction.

Reference numeral 15 is a main intersection region (SMC) of an extension region of each sense amplifier (S/A) 14 array in the row direction and an extension region of the MRD 12 array in the column direction.

Reference numeral 16 is a sub intersection region (SSC) of an extension region of each sub row decoder (SRD) 13 array in the column direction and an extension region of each sense amplifier (S/A) 14 array in the row direction.

As shown in FIG. 1A, in the center region the memory core, the sub array (SCA) 11, a layout region of the sub row decoder (SRD) 13, a layout region of the sense amplifier (S/A) 14, and the sub intersection region (SSC) 16 are two-dimensionally disposed. In the marginal regions of the memory core, which are the left side marginal region and the lower side marginal region in FIG. 1, a region 20a outside the sense amplifier (S/A) 14, a region (SAC) 20b outside the sub intersection region (SSC) 16, a layout region of the MRD 12, the main intersection region (SCM) 15, and a region 20c adjacent to the region (SAC) 20b and the main intersection region (SMC) 15 are one-dimensionally disposed. In the region 20a, a column selection driver, a secondary sense amplifier (not shown) and the like are disposed.

FIG. 1B is a block diagram of a part of the DRAM in FIG. 1A, particularly a block diagram showing the word drive line system and the word line system of the DRAM.

A main word drive line drive circuit (MWDRV DRV) 21 is disposed in the sub array 20b. A sub word drive line drive circuit 17 is disposed in the sub intersection region (SSC) 16 provided for the corresponding sub array 11. A row address signal Addr is inputted to the main word drive line drive circuit (MWDRV DRV) 21. Further, an enable/disable signal is inputted to the main word drive line drive circuit (MWDRV DRV) 21. To the sub word drive line drive circuits 17 (only one is shown in FIG. 1B) in one row, a main word drive line signal mwdrv_p corresponding to the address signal Addr is inputted from the main word drive line drive circuit (MWDRV DRV) 21 of the row through a main word drive line 18. Further, a block select signal BlockSel and a reset control signal Reset for controlling the reset start timing of the word drive line are inputted to the sub word drive line drive circuit 17.

The sub word drive line drive circuit 17 decodes the main word drive line signal mwdrv_p which corresponds to the address signal Addr, and outputs a sub word drive voltage and a sub word drive signal. The main word drive line signal decoded by the sub word drive line drive circuit 17 is supplied to the sub row decoders SRD (SRD#1, SRD#1, . . . , SRD#n) of the sub array 11 through sub word drive lines 19 (first word drive line wdrv_p and its complementary second word drive line wdrv_n).

The main row decoder (MRD) 12 receives a row address signal Addr different from the row address signal Addr inputted to the drive circuit 21. Also, the main row decoder (MRD) 12 receives the enable/disable signal. The main row decoder (MRD) 12 decodes the inputted address signal Addr to generate a main word line signal MWL. The main word line signal MWL is inputted to the sub row decoders SRD (SRD#0, SRD#1, . . . , SRD#n) of the sub array 11 to selectively drive the word lines SWL<0>, SWL<1>, . . . , SWL<n> in the sub array.

The main word drive line drive circuit (MWDRV DRV) 21 is disposed at the left side of the sub row decoder (SRD) 13 in FIG. 1A (to be precise, at the left side of the sub intersection region (SSC) 16 supposing, as shown in FIG. 1A, that the memory core is terminated at the sub intersection region (SSC) 16 and the sense amplifier S/A 14).

The two-stage resetting system according to the present embodiment can be applied to a DRAM which employ both the hierarchical word drive line configuration and the hierarchical word line configuration. The two-stage resetting system according to the present embodiment can also be applied to a DRAM which employ either the hierarchical word drive line configuration or the hierarchical word line configuration. Further, The two-stage resetting system according to the present embodiment can be applied to a DRAM which employ neither the hierarchical word drive line configuration nor the hierarchical word line configuration.

There will be explained below a case where the two-stage resetting system is applied in the sub word drive line drive circuit in FIG. 1B in the DRAM employing both the hierarchical word drive line configuration and the hierarchical word line configuration.

Figure 2:
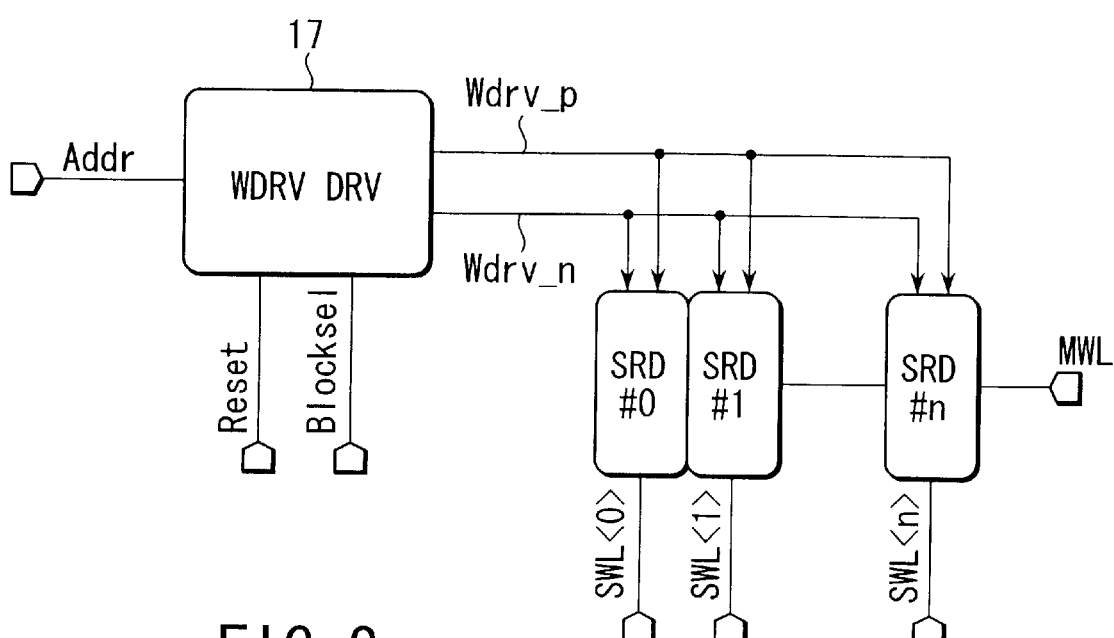
FIG. 2 is a block diagram of circuits including a word drive line drive circuit 17 and row decoders SRD of the DRAM in FIG. 1A.

FIG. 2 is a block diagram of circuits including the sub word drive line drive circuit 17 and the row decoder SRD of the DRAM in FIG. 1A.

In the circuit of FIG. 2, a row address signal Addr is inputted to the sub word drive line drive circuit 17. The row address signal Addr inputted to the sub word drive line drive circuit 17 of the circuit of FIG. 2 corresponds to the word drive line signal mwdrv_p supplied from the main word drive line drive circuit 21 to the sub word drive line drive circuit 17 through the main word drive line 18 in the circuit of FIG. 1B.

The sub word drive line drive circuit 17 decodes the row address signal Addr, outputs a word drive voltage to the first sub word drive line wdrv_p, and also outputs a word drive signal to the second sub word drive line wdrv_n which is complementary to the first sub word drive line wdrv_p. Further, the block select signal BlockSel and the reset control signal Reset for controlling the reset start timing of the word drive line are inputted to the sub word drive line drive circuit 17.

The sub word drive line drive circuit 17 resets the first sub word drive line wdrv_p when the reset control signal Reset is activated.

On the other hand, the sub row decoders SRD#0, SRD#1, . . . , SRD#n are provided corresponding to the word lines SWL<0>, SWL<1>, . . . , SWL<n> in the sub array. A word drive voltage is supplied from the sub word drive line drive circuit 17 to the sub row decoders SRD#0, SRD#1, . . . , SRD#n through the first sub word drive line wdrv_p, and a word drive control signal is supplied from the sub word drive line drive circuit 17 to the sub row decoders SRD#0, SRD#1, . . . , SRD#n through the second sub word drive line wdrv_n. The sub row decoders SRD#0, SRD#1, . . . , SRD#n receive and decode the row address input MWL, and selectively drive the SWL<0>, SWL<1>, . . . , SWL<n>.

Figures 3A, 3B:
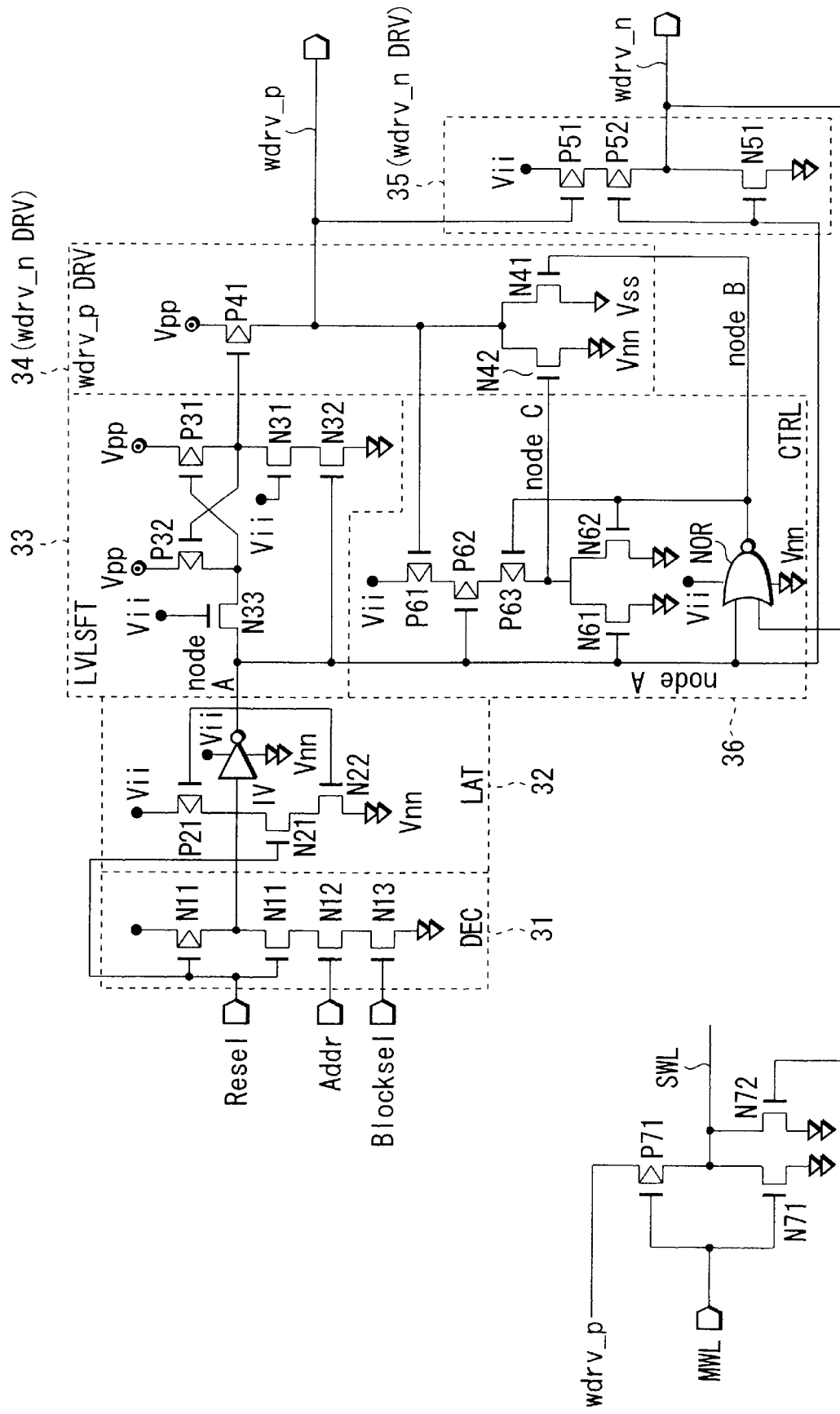
FIG. 3A is a circuit diagram of the word drive line drive circuit 17 in FIG. 2.
FIG. 3B is a circuit diagram of one portion of sub row decoder (SRD) in FIG. 2.

FIG. 3A is a circuit diagram showing an example of the sub word drive line drive circuit 17 in FIG. 2.

The sub word drive line drive circuit 17 comprises a decoding circuit (DEC) 31, a dynamic latch circuit (LAT) 32, a level shifting circuit (LVLSFT) 33, a first word drive line control circuit (wdrv_p DRV) 34, a second word drive line control circuit (wdrv_n DRV) 35, and a two-stage reset control circuit 36. In FIG. 3A, Vii is a power supply voltage (for example, an internal power supply voltage down-converted from an external power supply voltage in a DRAM), Vpp is a boosted power supply voltage boosted in a DRAM, Vnn is a negative voltage, and Vss is the ground potential.

The decoding circuit 31 receives and decodes the block select signal BlockSel for selecting the sub array 11, and the address signal Addr for specifying the selected line in the sub array. The decoding circuit 31 further receives the reset control signal Reset for controlling the reset start timing of the first sub word drive line wdrv_p, and resets the latch circuit (LAT) 32 so as to reset the decode output.

In the configuration of the decoding circuit 31, one PMOS transistor P11 and three NMOS transistors N11, N12, N13 are connected in series between Vii node and Vnn node. At each gate of the PMOS transistor P11 and NMOS transistor N11, a reset control signal Reset is inputted, at the gate of the NMOS transistor N12, an address signal Addr is inputted, and at the gate of the NMOS transistor N13, a block select signal BlockSel is inputted. The series connection node of the PMOS transistor P11 and three NMOS transistors N11, N12, N13 is the decode output node.

The latch circuit 32 latches the output of the decoding circuit 31, receives a reset control signal Reset, and resets the potential of latch output node A.

In the configuration of the latch circuit 32, an input node of an inverter circuit IV is connected to the decode output node of the decoding circuit 31, a PMOS transistor P21 is connected between the input node of the inverter circuit IV and Vii node, and two NMOS transistors N21, N22 are connected in series between the input node of the inverter circuit IV and Vss node. At each gate of the PMOS transistor P21 and NMOS transistor N22, the potential of the decode output node is inputted, and at the gate of the NMOS transistor N21, the reset control signal Reset is inputted. The output node of the inverter circuit IV becomes the latch output node A.

The level shifting circuit 33 receives the potential of the output node A of the latch circuit 32, and shifts the level to the boosted supply voltage for driving word lines.

In the configuration of the level shifting circuit 33, one PMOS transistor P31 and two NMOS transistors N31, N32 are connected in series between the Vpp node and Vnn node. The gate of the PMOS transistor P31 is connected to the latch output node A through the NMOS transistor N33 of which gate is provided with Vii, Vii is also given to the gate of the NMOS transistor N31, and the gate of the NMOS transistor N32 is connected to the latch output node A.

A PMOS transistor P32 is connected between the Vpp node and the gate of the PMOS transistor P31, and the gate of this PMOS transistor P32 is connected to the drain of the PMOS transistor P31. The series connection node of the PMOS transistor P31 and two NMOS transistors N31, N32 is the level shift output node.

The first word drive line control circuit 34 comprises a PMOS transistor P41 for driving the sub word drive lines, a first reset circuit, and a second reset circuit. The PMOS transistor P41 for driving the sub word drive lines is driven by a signal of level shift output node and outputs a word drive voltage to wdrv_p. The first reset circuit resets wdrv_p to a first potential (Vss in this example) by a first control signal, and the second reset circuit resets wdrv_p to a second potential (Vnn, lower than the first potential, in this example) by a second control signal.

As the transistor for driving the sub word drive lines, in this example, a PMOS transistor 41 is used, and its source is connected to Vpp node, and a signal of level shift output node is fed into the gate. wdrv_p is connected to the drain of the PMOS transistor 41.

The first reset circuit comprises an NMOS transistor 41, of which drain and source are connected to the drain (connection node of first sub word drive line wdrv_p) of the PMOS transistor P41 for driving the sub word drive lines and Vss node, respectively, and of which gate receives a first control signal.

The second reset circuit comprises an NMOS transistor N42, and its drain and source are connected to the drain (connection node of wdrv_p) of the PMOS transistor P41 for driving the sub word drive lines and Vnn node, respectively, and a second control signal is inputted to the gate of the NMOS transistor N42.

The second sub word drive line control circuit 35 receives the signal of latch output node A and the potential of the first sub word drive line wdrv_p, and outputs a sub word drive signal to wdrv_n.

In the configuration of the second word sub drive line control circuit 35, two PMOS transistors P51, P52 and one NMOS transistor N51 are connected in series between Vii node and Vnn node. A second sub word drive line wdrv_n is connected to the series connection node of the PMOS transistors P51, P52 and NMOS transistor N51. A first sub word drive voltage from wdrv_p is inputted to the gate of the PMOS transistor P51, and a signal of latch output node A is inputted to each gate of the PMOS transistor P52 and NMOS transistor N51.

In such a configuration, the second sub word drive line wdrv_n is driven by the AND output of the output of the latch output node A and potential of first sub word drive line wdrv_p.

The reset control circuit (CTRL) 36 receives potential information of wdrv_p by feedback, changes over from the active state of the first control signal to the active state of the second control signal on the basis of the potential information of wdrv_p, and resets and controls the potential of wdrv_p in two stages. In this example, the reset control circuit (CTRL) 36 receives the signal of latch output node A and signal of wdrv_n, and resets and controls the potential of wdrv_p in two stages in a self-align manner.

The reset control circuit (CTRL) 36 comprises a two-input logic gate (NOR gate in this example), in which the signal of latch output node A and signal of wdrv_n are inputted, and a logic OR of the two signals is calculated and issued to a first control signal output node B (node B).

Three PMOS transistors P61, P62, P63 are connected in series between Vii node and a second control signal output node C (node C), and two NMOS transistors N61, N62 are connected in parallel between the second control signal output node C and Vnn node.

The potential of the first sub word drive line wdrv_p is inputted to the gate of the PMOS transistor P61, the signal of the latch output node A is inputted to the gate of the PMOS transistor P62, and the output signal of the NOR gate is inputted to the gate of the PMOS transistor P63.

The signal of the latch output node A is inputted to the gate of the NMOS transistor N61, and the output signal of the NOR gate is inputted to the gate of the NMOS transistor N62.

The output signal (output signal of the first control signal output node B) of the NOR gate is inputted to the gate of the NMOS transistor N41 of the first reset circuit, and the output signal of the second control signal output node C is inputted to the gate of the NMOS transistor N42 of the second reset circuit.

The inverter circuit IV in the latch circuit 32 is provided with Vii and Vnn as operating power supplies, and the potential of "H" level output is Vii, and the potential of "L" level output is Vnn. Further, in the NOR gate in the reset control circuit (CTRL) 36, similarly to the inverter circuit IV in the latch circuit 32, Vii and Vss are given as operating power supplies, the potential of "H" level output is Vii, and the potential of "L" level output is Vss.

FIG. 3B is a circuit diagram of one sub row decoder out of sub row decoders SRD#0, SRD#1, . . . , SRD#n 13 in FIG. 2.

The sub row decoder SRD is connected to the first sub word drive line wdrv_p and second sub word drive line wdrv_n, and is further connected to memory cells through one sub word line SWL.

That is, the sub row decoder SRD comprises a PMOS transistor P71 for driving word lines, an NMOS transistor N71 for word line potential pull-down, and an NMOS transistor N72 for noise killer. The PMOS transistor P71 for driving word lines has source connected to wdrv_p, and drain connected to SWL, and receives a word line select signal MWL at the gate thereof. The NMOS transistor N71 for word line potential pull-down has drain connected to SWL, and source connected to Vnn node, and receives MWL at the gate thereof. The NMOS transistor N72 for noise killer is connected parallel to the NMOS transistor N71, and receives a sub word drive signal from wdrv_n at the gate thereof.

The operation of the circuit in FIG. 3A and FIG. 3B is explained below.

When setting the first sub word drive line wdrv_p, the reset control signal Reset is "H" level, and both address signal Addr and BlockSel both become "H" level. As a result, the decode output of the decoding circuit 31 is "L" level. The decode output "L" level is inverted in the inverter circuit IV of the latch circuit 32, and the latch output node A becomes "H" level, the output of the level shifting circuit 33 becomes "L" level, the PMOS transistor P41 in the first sub word drive line control circuit 34 is turned on, and wdrv_p becomes "H" level (=Vpp). The potential of setting state "H" level of the wdrv_p is Vpp.

At this time, since the latch output node A is "H" level, the output of the NOR gate in the reset control circuit (CTRL)

36 is "L" level (=Vss), and the NMOS transistor N41 of the first reset circuit is off. Besides, since the latch output node A is "H" level, the NMOS transistor N61 in the reset control circuit (CTRL) 36 is on, and the second control signal output node C is "L" level, the NMOS transistor N42 of the second reset circuit is also off.

As mentioned above, when the first sub word drive line wdrv_p is set, in the second sub word drive line control circuit 35, the PMOS transistor P51 of which gate is provided with the potential of wdrv_p is turned off, and the NMOS transistor P52 of which gate is provided with the "H" level signal of the latch output node A is turned on, so that wdrv_n becomes "L" level. The potential of the reset state "L" level of wdrv_n is Vnn, which is the same as the potential Vnn of the reset state "L" level of wdrv_p to be described later.

When resetting the wdrv_p, to begin with, the reset control signal Reset becomes "L" level. When the reset control signal Reset becomes "L" level, the PMOS transistor P11 in the decoding circuit 31 is turned on, the decode output becomes "H" level, the latch output node A becomes "L" level, the output of the level shifting circuit 33 is "H" level, and the PMOS transistor P41 in the first word drive line control circuit 34 is turned off.

At this time, as the latch output node A is "L" level and the wdrv_n signal is "L" level, the NOR gate output in the reset control circuit (CTRL) 36 becomes "H" level. Therefore, the NMOS transistor N41 of the first reset circuit is turned on, the wdrv_p is connected at Vss, and the resetting operation in the first stage is executed.

As a result, the potential of wdrv-p begins to drop, and when dropped sufficiently, the PMOS transistor P51 in the second sub word drive line control circuit 35 of which gate is provided with this potential is turned on. At this time, the latch output node A is "L" level and the PMOS transistor P52 in the second word drive line control circuit 35 is turned on, and the wdrv_n is connected at Vii node.

Consequently, the potential of wdrv_n begins to rise, and when risen sufficiently, the output node B of the NOR gate in the reset control circuit (CTRL) 36 becomes "L" level, and the NMOS transistor N41 in the first reset circuit is turned off, while the PMOS transistor P63 in the CTRL 36 is turned on. At this time, since the potential of wdrv_p is Vss, the PMOS transistor P61 in the reset control circuit (CTRL) 36 is turned on, and the latch output node A is "L" level, so that the PMOS transistor P62 in the reset control circuit (CTRL) 36 is turned on.

Therefore, as mentioned above, when the output node B of the NOR gate becomes "L" level and the PMOS transistor P63 in the reset control circuit (CTRL) 36 is turned on, the second control signal output node C becomes "H" level (=Vii), the NMOS transistor N42 in the second reset circuit is turned on, and the wdrv_p is connected at Vnn, and the resetting operation of the second stage is executed. The potential of the reset state of wdrv_p is Vnn.

In this case, since there is a certain time difference between end of resetting operation of the first stage and start of resetting operation of the second stage, the resetting operation of the second stage is executed securely. That is, from the timing when the first control signal output node B of the NOR gate becomes "L" level (the signal for controlling the NMOS transistor N41 of the first reset circuit is inactivated), until the timing when the second control signal output node C becomes "H" level (the signal for controlling the NMOS transistor N42 in the second reset circuit is activated), there is a time difference corresponding to the operation time of the composite gate circuit comprising the MOS transistors P61, P62, P63, N61, and N62 (delay time corresponding to one stage of gate circuit).

Here, since the PMOS transistor P61 in the reset control circuit (CTRL) 36 is turned on while the potential of wdrv_p is "L" level, the timing of the second control signal output node C becoming "H" level is defined in the period when the potential of wdrv_p is "L" level, so that malfunction of the resetting operation of the second state may be prevented, however the PMOS transistor P61 is not essential and may be omitted.

Thus, when the first sub word drive line wdrv_p is reset, in the second word drive line control circuit 35, the PMOS transistor P51 of which gate is provided with the potential of wdrv_p is turned on, the PMOS transistor P52 of which gate is provided with the signal "L" level of the latch output node A is turned on, and the NMOS transistor N51 of which gate is provided with the signal "L" level of the latch output node A is turned off, so that wdrv_n becomes "H" level. The potential of the setting state "H" level of wdrv_n is Vii, which is lower than the potential Vpp of the setting sate "H" level of wdrv_n.

Thus, by using Vii in the setting potential of wdrv_n, the voltage swing of wdrv_n is smaller than the voltage swing of wdrv_p, and the power consumption is reduced. Further, since Vpp is not used in the setting potential of wdrv_n, the drivability of the Vpp generating pump circuit can be made small accordingly, with the result that the required area of the Vpp generating pump circuit can be decreased and thus the chip area can be reduced.

In the NMOS transistor N41 of the first reset circuit, in its off state, since Vnn lower than Vss being the source electrode potential is applied to the gate thereof to have a negative potential between the gate and source of the NMOS transistor N41. Hence, even when a MOS transistor having a low threshold voltage is used as the NMOS transistor N41, the cut-off current Ioff is not increased. Therefore, as the NMOS transistor N41 of the first reset circuit, by using a MOS transistor having a gate threshold voltage lower than the NMOS transistor N42 of the second reset circuit, the resetting operation in the second stage in its on state can be more securely executed.

Figure 4A:
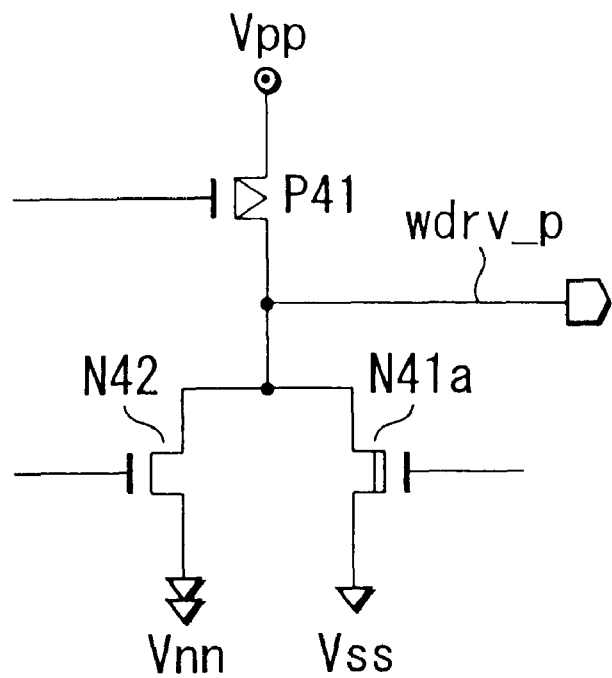
FIG. 4A is a circuit diagram of a modified example of a first reset circuit of a first word drive line control circuit (wdrv_p DRV) in FIG. 3A.
Figure 4B:
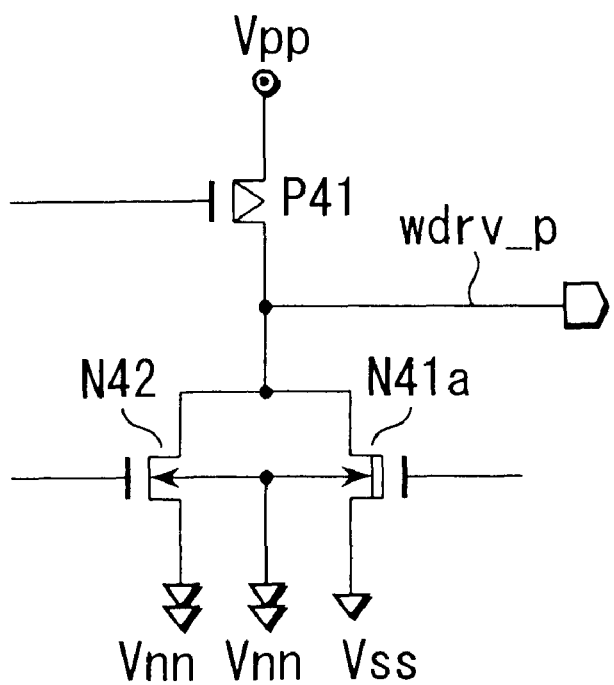
FIG. 4B is a circuit diagram of another modified example of the first reset circuit of the first word drive line control circuit (wdrv_p DRV) in FIG. 3A.
Figure 5A:
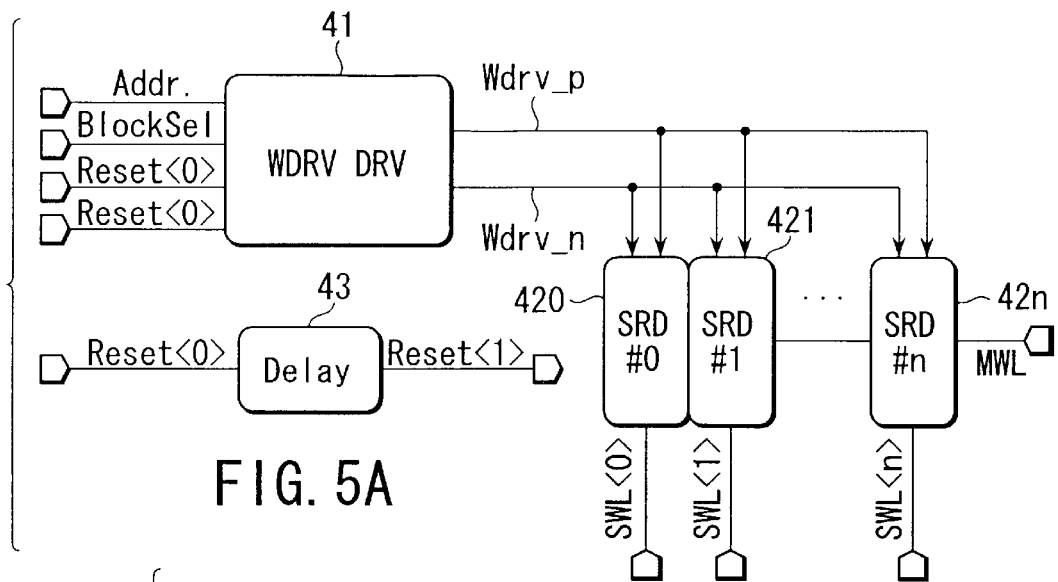
FIG. 5A is a block diagram of circuits including a word drive line drive circuit and a row decoder in a conventional DRAM.
Figure 5B:
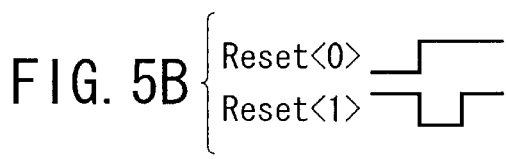
FIG. 5B is a signal chart of a reset control signal Reset<0> and a reset control signal Reset<1> in the circuits in FIG. 5A.
Figure 6:
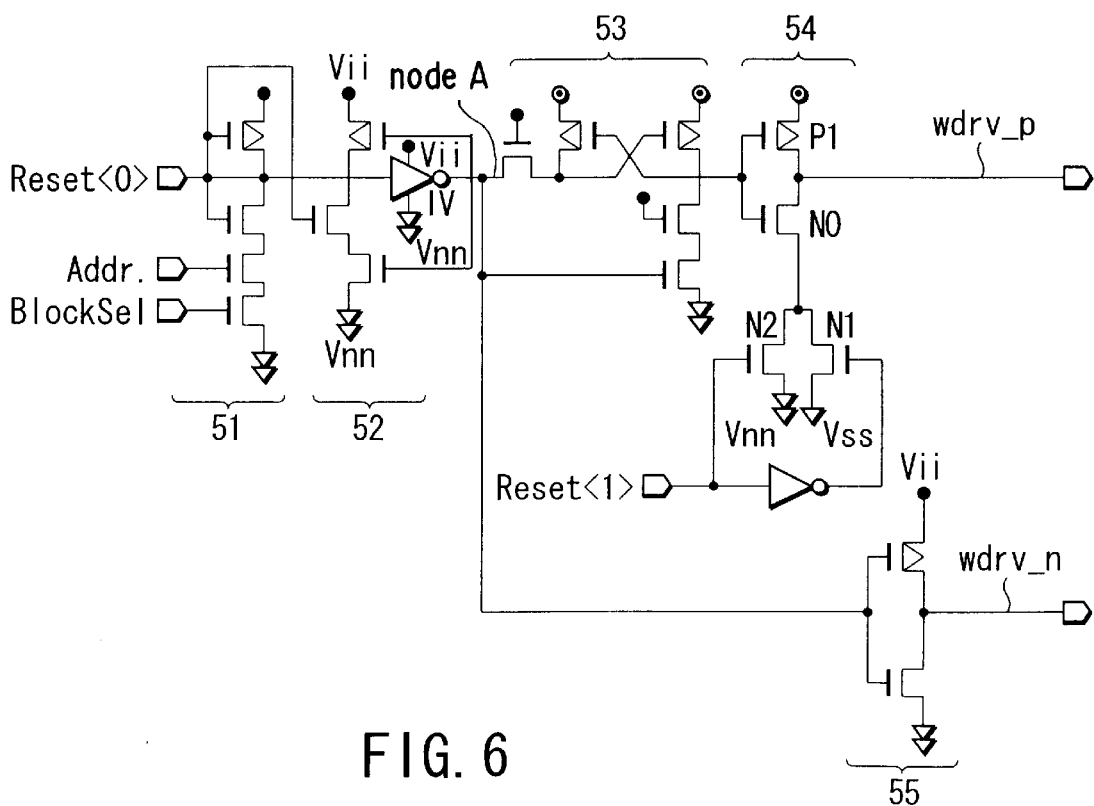
FIG. 6 is a circuit diagram of a word drive line drive circuit 41 in FIG. 5A.
Figure 7:
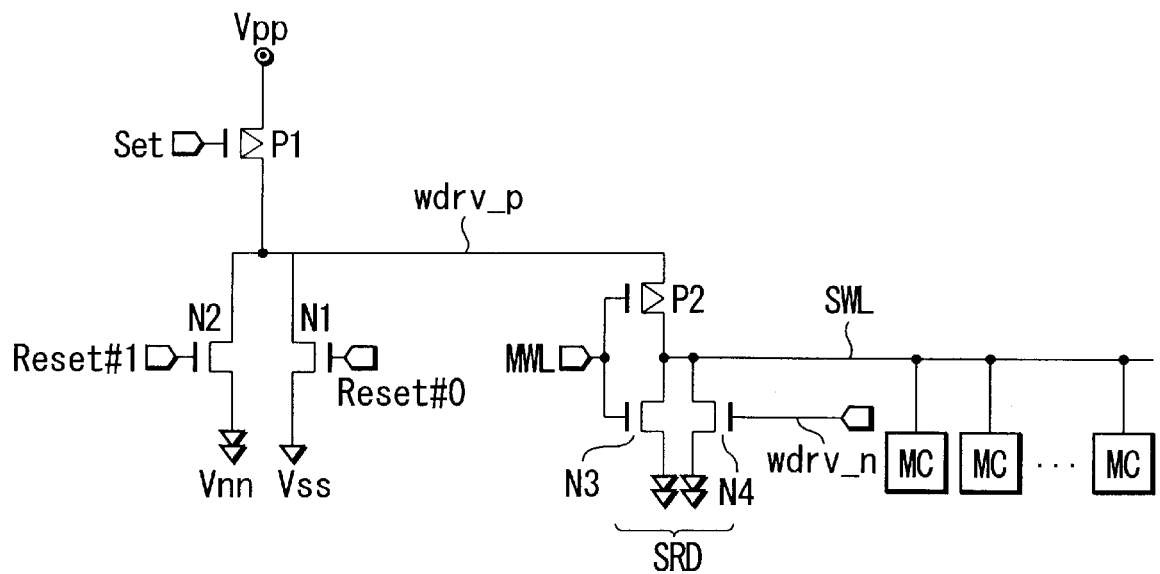
FIG. 7 is a circuit diagram cited for explaining the principle of two-stage resetting operation in the circuit in FIG. 6.
Figure 8:
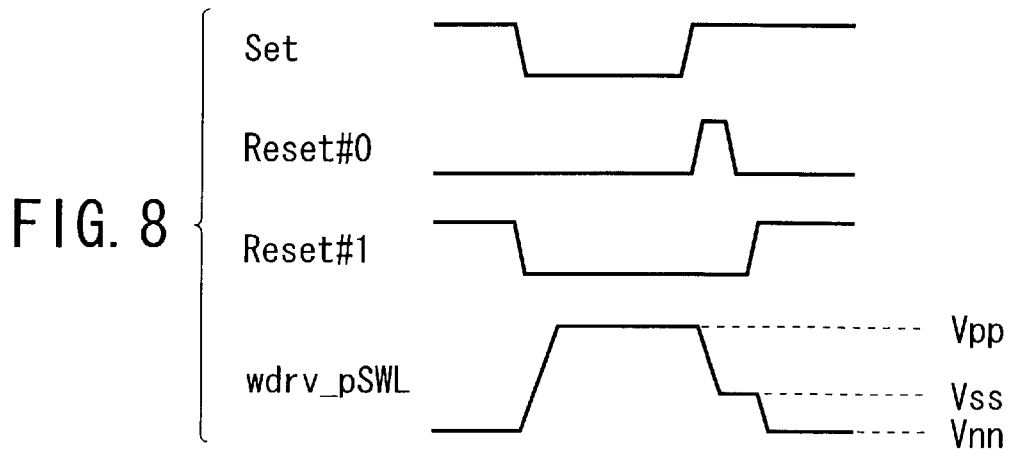
FIG. 8 is a signal chart of an example of two-stage resetting operation in the circuit in FIG. 7.

Furthermore, as shown in FIG. 4A, as the NMOS transistor N41 of the first reset circuit, the NMOS transistor N41a of a lower gate threshold voltage may be used. In this case, it is required that, as shown in FIG. 4B, the substrate (well) potential of the NMOS transistor N41a of the first reset circuit is set at Vnn, as with the substrate (well) potential of the NMOS transistor 42 of the second reset circuit. By doing so, there is no need to separate the wells of the two NMOS transistors N41a, N42 from each other, the layout area can be reduced.

In both NMOS transistors N41a and N42, a lower gate threshold voltage may be used than in the NMOS transistor used in other circuits such as two-stage reset control circuit (CTRL) 36. In this case, it is preferable to set the substrate potential of all NMOS transistors included in the sub word drive line control circuits wdrv_p DRV and wdrv_n DRV at Vnn. The reason is that a plurality of the word drive line control circuits wdrv_p DRV and wdrv_n DRV are disposed in the memory core, however it is actually difficult to separate all well potentials, and in this point of view by setting all well potentials at Vnn, the chip layout area can be reduced.

For the same reason, it is preferable that the substrate potentials of all of the MOS transistors in the circuits of FIG. 3A are set to Vnn.

Meanwhile, the potential of wdrv_p may be directly fed back to the reset control circuit (CTRL) 36, however in this example, without feeding back the potential of wdrv_p directly to the reset control circuit (CTRL) 36, the signal of wdrv_n depending on the potential of wdrv_p is fed back to the reset control circuit (CTRL) 36, so that the two-stage resetting of each word drive line can be executed more securely.

Thus, according to the embodiment as described, the two-stage reset control circuit (timing control circuit) is provided in each word drive line drive circuit, and the potential of wdrv_p is fed back to the reset control circuit (CTRL) 36. Thus, the timing of reset operation of the second stage corresponding to the potential of wdrv_p is determined automatically, and the two-stage resetting is operated in self-align manner.

Therefore, regardless of the layout position in the chip of the word drive line drive circuit or variance in the chip of the device characteristic and the wiring characteristic, the two-stage resetting operation of the word drive line can be executed securely without delay.

For example, in the DRAM employing the hierarchical word drive line configuration shown in FIG. 1A, the two-stage resetting method is employed in the sub word drive line drive circuit disposed in the sub intersection region (SSC) 16 near each sub array. Thereby, increase in the layout area on the memory chip can be suppressed, and the optimum operation timing can be set in each reset circuit.

As described above, according to the semiconductor memory device of the embodiment of the present invention, regardless of the layout position in the chip of the word drive line drive circuit or fluctuations with the chip of each device parameter, the potential of each word drive line can be reset securely in two stages in self-align manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    at least one memory cell array in which a plurality of word lines and a plurality of bit lines intersect with each other, including a plurality of memory cells to be selected by the word lines and the bit lines;
    a word drive line drive circuit which decodes one part of an address signal, and outputs a word drive voltage to a first word drive line; and
    a plurality of row decoders which are provided corresponding to the plurality of word lines in the memory cell array and supplied with a word drive control signal from the first word drive line, and decode other part than said one part of the address signal to selectively drive a corresponding word line,
    wherein said word drive line drive circuit comprises:
        a decoding circuit which decodes said one part of the address signal;
        a latch circuit which latches the decode output of the decoding circuit, and receives a reset control signal for controlling the reset start timing of the first word drive line to reset the decode output of the decoding circuit;
        a first word drive line control circuit which supplies a word drive voltage corresponding to the decode output of the decoding circuit to the first word drive line, and has a first reset circuit connected between the first word drive line and a first potential node to reset the first word drive line to a first potential when a first control signal is activated and a second reset circuit connected between the first word drive line and a second potential node to reset the first word drive line to a second potential when a second control signal is activated; and
        a two-stage reset control circuit which controls changeover from the activated state of the first control signal to the activated state of the second control signal on the basis of the potential of the first word drive line to change the potential of the first word drive line in two stages including a first stage of said first potential and a second stage of said second potential.

2. The semiconductor memory device according to claim 1, wherein said latch circuit dynamically latches the decode output of the decoding circuit, and resets the latch output when receiving the reset control signal.

3. The semiconductor memory device according to claim 1, further comprising a level shifting circuit which receives the potential of the output node of the decoding circuit, and shifts the potential to a level of boosted voltage for driving word lines.

4. The semiconductor memory device according to claim 1, wherein the potential of the second potential node is lower than the potential of the first potential node.

5. The semiconductor memory device according to claim 4, wherein the first potential node is a ground potential, and the second potential node is a negative potential.

6. The semiconductor memory device according to claim 5, wherein the first reset circuit comprises an NMOS transistor provided between the first word drive line and the ground potential, having a drain electrode connected to the first word drive line and a source connected to the ground potential; and
    the second reset circuit comprises an NMOS transistor provided between the first word drive line and the negative potential, having a drain electrode connected to the first word drive line and a source connected to the negative potential, wherein
        gate threshold voltages of the NMOS transistor of the first reset circuit and the NMOS transistor of the second reset circuit are lower than a gate threshold voltage of the NMOS transistor in the two-stage reset control circuit.

7. The semiconductor memory device according to claim 5, wherein the first reset circuit comprises an NMOS transistor provided between the first word drive line and the ground potential, having a drain electrode connected to the first word drive line and a source connected to the ground potential; and
    the second reset circuit comprises an NMOS transistor provided between the first word drive line and the negative potential, having a drain electrode connected to the first word drive line and a source connected to the negative potential, wherein
        a gate threshold voltage of the first NMOS transistor of the second reset circuit is lower than a gate threshold voltage of the NMOS transistor of the first reset circuit.

8. The semiconductor memory device according to claim 7, wherein an internal power supply potential and ground potential are used as an operating power supply potential of a circuit which generates the first control signal in the two-stage reset control circuit, and the internal power supply potential and negative potential are used as an operating power supply potential of a circuit which generates the second control signal.

9. The semiconductor memory device according to claim 5, wherein the first reset circuit comprises an NMOS transistor provided between the first word drive line and the ground potential, having a drain electrode connected to the first word drive line and a source connected to the ground potential; and the second reset circuit comprises an NMOS transistor provided between the first word drive line and the negative potential, having a drain electrode connected to the first word drive line and a source connected to the negative potential, wherein a substrate potential of the first NMOS transistor of the first reset circuit is the negative potential, and is the same as a substrate potential of the second NMOS transistor of the second reset circuit.

10. The semiconductor memory device according to claim 9, wherein an inactivating level of the first control signal is the ground potential, and an inactivating level of the second control signal is the negative potential.

11. The semiconductor memory device according to claim 1, further comprising:

a second word drive line control circuit which is driven on the basis of the decode output of the decoding circuit and the potential of the first word drive line, and outputs a signal of complementary to the potential of the first word drive line to the second word drive line, wherein the timing for the changeover of the first and second control signals in the two-stage reset control circuit is controlled on the basis of the potential of the second word drive line depending on the potential of the first word drive line.

12. The semiconductor memory device according to claim 11, wherein the reset potential of the second word drive line is a negative potential of the second potential node, and is the same as the reset potential of the first word drive line.

13. The semiconductor memory device according to claim 11, wherein the set potential of the second word drive line is lower than the set potential of the first word drive line.

14. The semiconductor memory device according to claim 11, wherein substrate potentials of all of NMOS transistors included in the first word drive line control circuit and the second word drive line control circuit are the negative potential.

15. The semiconductor memory device according to claim 11, wherein said two-stage reset control circuit comprises:

a two-input logic gate which receives the decode output of the decoding circuit and the potential of the second word drive line, and delivers a logic OR output to the first control signal output node;

a first PMOS transistor which is connected in series between the internal power supply node and the second control signal output node and receives the decode output of the decoding circuit at the gate thereof, and a second PMOS transistor which receives the output of the first control signal output node at the gate thereof; and a first NMOS transistor which is connected in parallel between the second control signal output node and the negative potential node and receives the decode output of the decoding circuit at the gate thereof, and a second NMOS transistor which receives the output of the first control signal output node at the gate thereof, and the output of the first control signal output node is fed to the gate of the NMOS transistor of the first reset circuit, and the output of the second control signal output node is fed to the gate of the NMOS transistor of the second reset circuit.

16. The semiconductor memory device according to claim 15, further comprising a third PMOS transistor which is connected in series to the first and second PMOS transistors between the internal power supply node and the second control signal output node, and receives the potential of the first word drive line at the gate thereof.

17. The semiconductor memory device according to claim 11, wherein said two-stage reset control circuit comprises an OR circuit which performs a logic OR function on the decode output of the decoding circuit and the potential of the second word drive line and delivers a logic OR output, and controls the timing for changeover of the first and second control signals is controlled on the basis of the logic OR output of the OR circuit.

18. The semiconductor memory device according to claim 11, wherein said second word drive line control circuit comprises a fourth PMOS transistor which is connected in series between the internal power supply node and the second word drive line, and receives the potential of the first word drive line at the gate thereof, and a fifth PMOS transistor which receives the output of the decoding circuit at the gate thereof.

19. The semiconductor memory device according to claim 11, wherein said second word drive line is driven by the logic OR output of the decoding circuit and the potential of the first word drive line.

20. The semiconductor memory device according to claim 11, wherein a plurality of said memory cell arrays are provided, a sub word drive line drive circuit is disposed near each memory cell array, a main word drive line drive circuit is disposed commonly to the plurality of memory cell arrays, the sub word drive line drive circuit is selectively controlled by the main word drive line drive circuit, the row decoders are disposed in the side portion along the word line direction of each memory cell array, the word drive line drive circuit constitutes a part of the sub word drive line drive circuit, and is disposed at the side of the plurality of row decoders, and the decoding circuit of the sub word drive line drive circuit receives a block select signal input for selecting the memory cell array, and an address signal input for specifying the selection line in the memory cell array inputted from the main word drive line drive circuit through the main word drive line, and decodes these inputs to the decoding circuit.

21. The semiconductor memory device according to claim 11, wherein each row decoder comprises a PMOS transistor for word line drive connected between the first word drive line and the word line, and an NMOS transistor for noise killer connected between the word line and the second potential node, with the second word drive line connected at the gate thereof.

22. The semiconductor memory device according to claim 1, wherein a predetermined time difference is set from the timing of inactivating the first control signal till the timing of activating the second control signal.

23. The semiconductor memory device according to claim 22, wherein the time difference is a delay time corresponding to one stage of the gate circuit of the two-stage reset control circuit.

* * * * *